United States Patent [19]

Cripe

[11] Patent Number: 5,247,264
[45] Date of Patent: Sep. 21, 1993

[54] COMBINING CIRCUIT FOR CLASS-E RF POWER AMPLIFIERS

[75] Inventor: David W. Cripe, Quincy, Ill.

[73] Assignee: Broadcast Electronics, Inc., Quincy, Ill.

[21] Appl. No.: 940,498

[22] Filed: Sep. 4, 1992

[51] Int. Cl.$^5$ .............................................. H03F 3/217
[52] U.S. Cl. ...................................... 330/251; 330/51;
330/196; 330/124 D; 330/207 A; 330/295
[58] Field of Search ................. 330/51, 124 D, 195,
330/196, 207 A, 251, 295

[56] References Cited

U.S. PATENT DOCUMENTS 3,406,352 10/1968 Gardenghi ...................... 330/195 X
3,919,656 11/1975 Sokal et al. .......................... 330/51

*Primary Examiner*—James B. Mullins
*Attorney, Agent, or Firm*—Hill, Steadman & Simpson

[57] ABSTRACT

A combining circuit for Class-E RF power amplifiers includes a transformer for each power amplifier to be combined, the respective secondaries of the transformers being connected in series to the RF load of the system. Each of the transformers further has a tertiary winding, with one end connected to a first common circuit node, and the other end being connected to a second common circuit node via an inductance. A switchable reactive network is connected to the second common circuit node, and in the event that one of the power amplifiers is removed from the circuit, such as due to failure thereof, the primary terminating impedance of the transformer connected thereto will become a high impedance, and by appropriate switching of the reactive network, in combination with the remaining circuit components, the matching impedance necessary to maintain optimum operation of the remaining power amplifiers is achieved, with a benign VSWR being presented to the remaining power amplifiers.

6 Claims, 1 Drawing Sheet

COMBINING CIRCUIT FOR CLASS-E RF POWER AMPLIFIERS

BACKGROUND OF THE INVENTION

1. Field of the Invention

The present invention is directed to a circuit for combining the outputs of a plurality of Class-E RF power amplifiers, and is particularly directed to such a circuit which permits optimum operating conditions to be maintained when one or more of the power amplifiers is taken out of the circuit, such as by failure of that amplifier.

2. Description of the Prior Art

High power, solid-state RF systems customarily are created by summing the respective outputs of a plurality of RF power amplifiers modules, so as to deliver a single output signal. In systems wherein linear signal amplification is not required, it is desirable that the power amplifier modules operate in a highly efficient manner, and thus the power amplifiers in such systems are typically operated in Class C, D or E. For each of these classes of power amplifier operation, a unique and well-defined range of the power amplifier load impedances exists. Impedances outside of this defined range induce stresses in the amplified devices, which will result in the destruction of those devices.

In such systems, it is also usually desired that if one or more of the individual power amplifiers fails, the system can continue to operate, but at reduced power. In order to present a load to the remaining, operable power amplifiers which is still within the range of the acceptable values for reliable operation, means must be provided within the system to compensate for the effect which the failure of one or more of the power amplifier modules will have on the load impedance seen by the remaining, functional power amplifier modules.

Most combining systems currently in use are of the hybrid combiner type, in which any imbalance in the output voltage of the power amplifiers induces a voltage across a resistor, referred to as the "reject load." A hybrid combiner can be constructed so that regardless of the balance among the functioning power amplifiers, the load presented to those power amplifiers is a constant impedance. A significant disadvantage of known hybrid combining techniques is that, if one or more failed power amplifiers exists within the system, the power delivered to the load will be reduced by a factor proportional to the square of the number of failed power amplifiers, even though the power generated by each of the remaining power amplifiers is unchanged. Therefore, if one-half of the power amplifiers within a system using a hybrid combiner have failed, the total system output is halved as well. In this case, however, this power is divided equally between the reject load and the output load. Consequently, the system output is one-fourth of the original power. Additionally, the reject load must be capable of dissipating up to one-quarter of the system power. In a high power system, the reject load can therefore be an appreciable portion of the system cost.

Other combining circuits are known which dispense entirely with the use of a reject load, however, in such systems, for certain power amplifier failure modes, an excessive VSWR will be presented to the remaining power amplifiers, and the system must be shut down to protect those remaining power amplifiers.

A Class-E power amplifier, as exemplified in U.S. Pat. No. 3,919,656 (Sokal et al.) has high operating efficiencies due to the elimination of switching losses. Consequently, Class-E power amplifiers are used in numerous RF power systems. A known, representative Class-E circuit is shown in FIG. 1. The Class-E power amplifier therein is an RF power device, shown in FIG. 1 as a power transistor Q, which is operated as a switch so as to be driven "on" during 180° of the RF cycle. Direct-current power $V_{CC}$ is delivered from a source to the switch via an RF choke L1. The switch formed by the transistor Q is shunted by a capacitive reactance, represented by C1, which absorbs any parasitic capacitance present within the switching device. The load network is shown in FIG. 1 as the series combination of C2, L2 and R1. This load network, in combination with the capacitance C1, is tuned for optimal load impedance. The nature of the unique optimal power amplifier load impedance of the Class-E power amplifier circuit permits its application in power combining circuits which have numerous advantage over other types of known circuits. It remains a problem, however, to provide a circuit for combining multiple Class-E RF power amplifiers in such a manner as to allow operation of this system in the presence of failed power amplifiers, with a lesser reduction in the system output power than occurs in a convention hybrid combiner, while utilizing only reactive circuit components, and thus eliminating the requirement for a reject load.

SUMMARY OF THE INVENTION

It is an object of the present invention to provide a circuit for combining the outputs of multiple Class-E RF power amplifiers in a system which permits optimum operation of the system with one or more of the RF power amplifiers disabled.

It is another object of the present invention to provide such a circuit which presents a benign VSWR to the remaining, functional RF power amplifiers after one or more power amplifiers becomes disabled.

Another object of the present invention is to provide such a circuit which delivers a power output which is greater than the output delivered by conventional hybrid combiner circuits as a function of the proportion of failed power amplifiers to the total number of amplifiers in the system.

Another object of the present invention is to provide such a circuit without the use of resistive components within the combining network, and thereby eliminating the presence of a reject load.

The above objects are achieved in accordance with the principles of the present invention in a combining circuit for Class-E RF power amplifiers which combines such amplifiers in a manner so that, in the event of the failure of one or more power amplifiers, a benign VSWR is presented to the remaining, functional power amplifiers. This circuit includes, for each power amplifier, a transformer having a primary connected to the outputs of the power amplifier, with the secondary windings of all of the transformers being connected in series. This series combination of secondaries is connected to the RF load of the system. The load has an impedance at an RF carrier frequency consisting of a resistive part and an inductive reactive part. Each of the transformers further has a tertiary winding, with one end of each tertiary winding being connected to a first common circuit node, such as ground. The other end of each tertiary winding is connected to a second common circuit node via a respective inductance. The second common circuit node is connected to the first common circuit node via a switchable reactive network. In the event that one of the power amplifiers fails, it will present a short-circuit across the primary of its corresponding transformer, and the remaining, functional power amplifier will see a load impedance formed by the RF load shunted by the series combination of the inductances connected to the tertiary windings of the transformers, which will cause no damage to the remaining, functional power amplifiers. In the event that one of the power amplifiers is removed from the circuit, such as due to failure thereof, the primary terminating impedance of the transformer connected thereto will become a high impedance, and by appropriate switching of the reactive network, in combination with the remaining circuit components, the impedance matching necessary to maintain optimum operation of the remaining power amplifiers is achieved.

DESCRIPTION OF THE PREFERRED EMBODIMENTS

Figure 2:
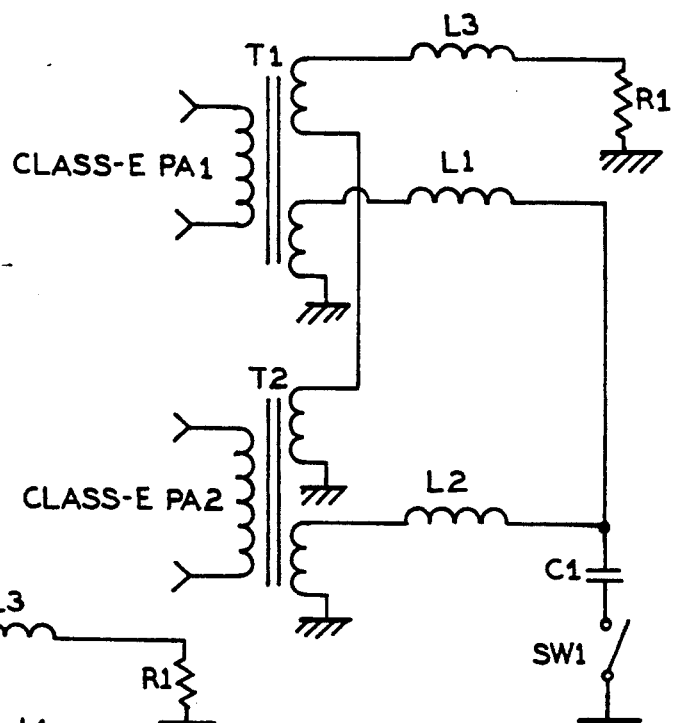
FIG. 2 is a circuit diagram of a first embodiment of a combining circuit constructed in accordance with the principles of the present invention.

A first embodiment of a Class-E power amplifier combining circuit is shown in FIG. 2 for the example of two Class-E power amplifiers, designated PA1 and PA2. It will be understood, however, that the combining technique in this embodiment, as well as in the further embodiment described below, may be expanded for a larger number of such power amplifiers.

Each Class-E power amplifier PA1 and PA2 has a transformer T1 or T2 allocated thereto. The respective RF outputs of the power amplifiers PA1 and PA2 are connected to the primaries of transformers T1 and T2. The respective secondaries of transformers T1 and T2 are connected in series, thereby summing their voltages.

The series-connected secondaries of T1 and T2 are connected to the system RF output load network. In the embodiment of FIG. 2, this is shown as the series combination of an inductance L3 and a resistance R1.

Each transformer T1 and T2 also has a tertiary winding, with one end of each tertiary winding being connected to a common circuit point, which in the embodiment of FIG. 2 is ground. The other end of each tertiary winding is connected to a further common circuit point via respective, equal inductances L1 and L2. One terminal of a capacitance C1 is connected to this further common circuit point. The other terminal of the capacitance C1 is connected to ground through a normally-open switch SW1. In the embodiment of FIG. 2, the capacitance C1 and the switch SW1 constitute a switchable reactive network.

The combining transformers T1 and T2 are placed in the circuit at a node presenting substantial reactance at the RF carrier frequency. In the case of the Class-E power amplifier, the load impedance required by the power amplifier has an inductive phase angle of approximately 45°.

The operation of the combiner circuit of FIG. 2 will be explained in the context of the following example. For simplicity, it will be assumed that the number of turns in the respective primary, secondary and tertiary windings of the transformers T1 and T2 are all equal. When the voltage outputs of the power amplifiers PA1 and PA2 are balanced, no current flows through the inductors L1 and L2. The respective load impedances seen by the power amplifiers PA1 and PA2 thus each constitute half of the reactance of the network consisting of the inductance L3 and the resistance R1. The typical failure mode of solid-state RF devices is that of a short-circuit across the output terminals of the device. If either of the power amplifiers PA1 or PA2 fails in this typical manner, it will thus have the effect of placing a short-circuit across the primary of its allocated combining transformer T1 or T2. The remaining power amplifier will then see, as its load impedance, the series combination of the inductance L3 and the resistance R1, shunted by the series combination of inductors L1 and L2. Because the Class-E power amplifier can withstand a substantial mis-tuning of its load in terms of inductance, the remaining, functional power amplifier will suffer no damage as it continues to operate. The power output will, depending on the value of L1 and L2, drop to between 25% and 50% of the total output power of the system with two functioning power amplifiers.

In the event that one of the power amplifiers is completely removed from the circuit, the primary terminating impedance of the transformer T1 or T2 will then become a high impedance. The removal of a power amplifier must also cause the closure of the switch SW1, thereby connecting C1 to ground. The closure of the switch SW1 can be undertaken either manually or automatically in the event of the removal of a power amplifier. In this case, the network consisting of the inductors L1 and L2 and the capacitor C1 becomes a "T" network, which can perform the impedance matching necessary to transform the load impedance L3 and load resistance R1 to that load required for optimum operation by the remaining power amplifier.

Figure 3:
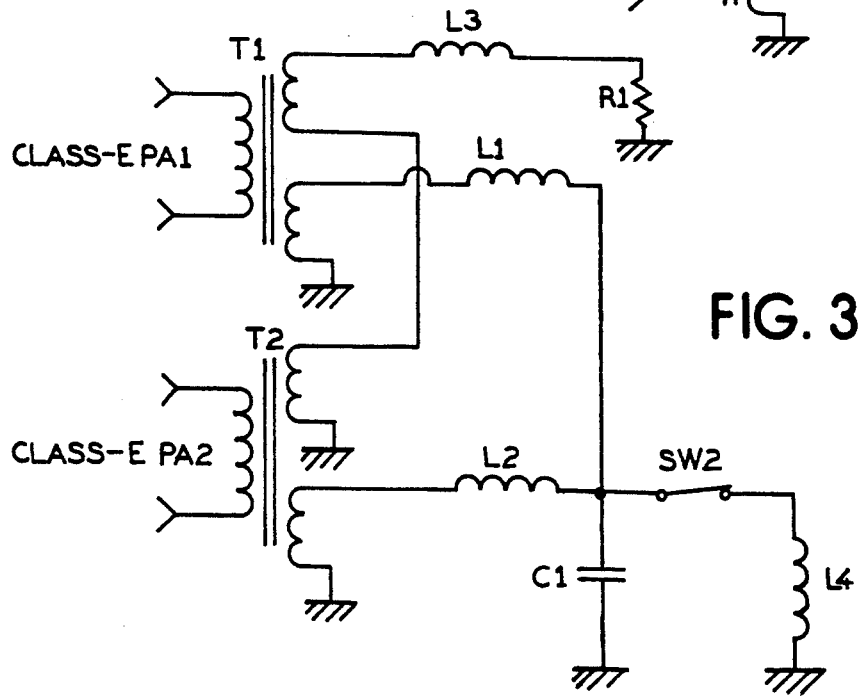
FIG. 3 is a circuit diagram of a second embodiment of a combining circuit constructed in accordance with the principles of the present invention.

A second embodiment of a combining circuit also for the example of two power amplifiers PA1 and PA2, is shown in FIG. 3. The embodiment of FIG. 3 differs from that of FIG. 2 in the components comprising the switchable reactive network connected to the further common circuit point. In the embodiment of FIG. 3, this switchable reactive network is formed by the capacitor C1, this time connected permanently between the further common circuit point and ground, and an inductor L4 having one terminal connected to ground and the other terminal connected to the further common circuit node via a normally-closed switch SW2. The combination of the switch SW2 and the inductor L4 is thus in parallel with the capacitor C1. The reactance of the inductor L4 at the RF carrier frequency is dimensioned to be equal to the negative of the reactance of the capacitor C1, and thus their parallel combination results in a high impedance at the RF carrier frequency. If a power amplifier is removed from the circuit in the embodiment of FIG. 3, the switch SW2 is opened, either manually or automatically, and the same "T" network is then presented to the remaining, functional power amplifier, as discussed above in connection with FIG. 2.

Figure 1:
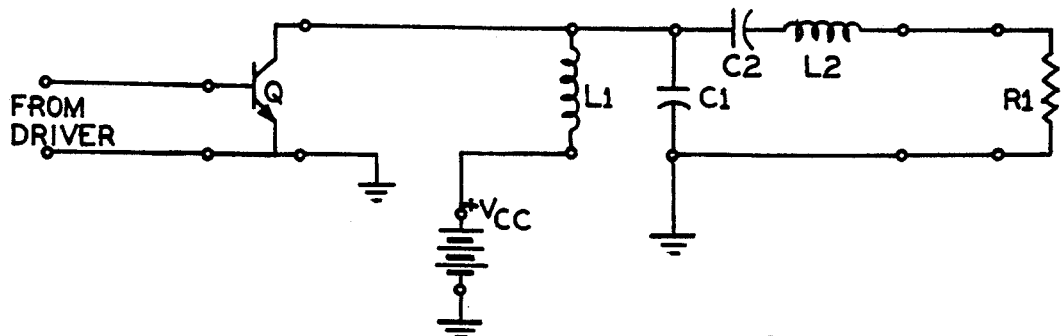
FIG. 1 is a circuit diagram of a typical, known Class-E power amplifier circuit, as noted above.
Figure 4:
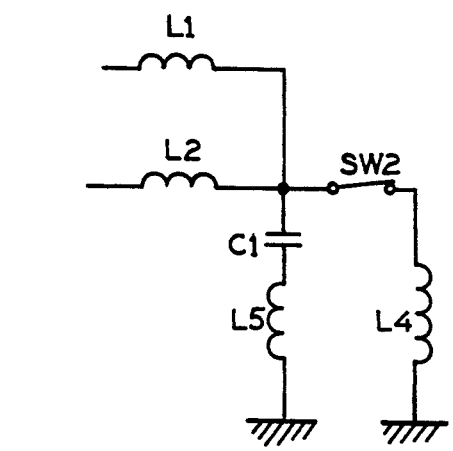
FIG. 4 is a circuit diagram of a third embodiment of a combining circuit constructed in accordance with the principles of the present invention.

A further embodiment is shown in FIG. 4, wherein only the inductors L1 and L2 and the switchable reactive network are shown, the remainder of the circuit of FIG. 4 being as it appears in FIGS. 2 and 3. In the embodiment of FIG. 4, the switchable reactive network is formed by a series connection between the further common circuit point and ground of the capacitor C1 and a further inductor L5. This series combination is connected in parallel with the normally-closed switch SW2 and the inductor L4.

The values for the inductors L1 and L2 and the capacitor C1 are established by the following relationships:

$$I_{L1} = (V - V_{C1})/L1,$$

$$I_{L2} = (V_{C1} + V)/(L2 + Z_L)$$

and $$V_{C1} = (I_{L1} - I_{L2})C1,$$

wherein $V_{C1}$ is the voltage across the capacitor C1, $Z_L$ is the load impedance comprised of the inductance L3 and the resistance R1, $I_{L1}$ is the current through the inductor L1, $I_{L2}$ is the current through the inductance L2, and V is the voltage at the transformer primary. From these relationships, the values of L1, L2 and C1 can be derived iteratively.

Although modifications and changes may be suggested by those skilled in the art, it is the intention of the inventor to embody within the patent warranted hereon all changes and modifications as reasonably and properly come within the scope of his contribution to the art.

I claim as my invention:

1. A circuit for combining a plurality of Class-E power amplifiers, said circuit being connectable to an RF load having an impedance at an RF carrier frequency consisting of an inductive reactive part and a resistive reactive part, said circuit comprising:
    a plurality of transformers respectively connectable to said plurality of Class-E power amplifiers;
    each transformer having a primary winding connected across the outputs of one of said Class-E power amplifiers, secondary winding, and a tertiary winding;
    the respective secondary windings of said transformers being connected in series to form a series combination of secondary windings which is connectable to said RF load;
    each tertiary winding having a first terminal connected to a first common circuit point, and having a second terminal;
    a plurality of equal value inductors respectively connected in series with said second terminals of said tertiary windings, and connected together at a second common circuit point; and
    a switchable, exclusively reactive network means, including a capacitor connected to said second common circuit point, for presenting a benign VSWR, in the event of a failure of one of said power amplifiers, to the remaining, functional power amplifiers, and for switching, upon the removal of a power amplifier from one of said primary windings, for forming an impedance matching network among said capacitance and said inductances for presenting an optimum impedance to the remaining, functional power amplifiers.

2. A circuit as claimed in claim 1 wherein said network means comprises a normally-open switch connected in series with said capacitor between said second common circuit point and ground, said normally-open switch closing upon the removal of a power amplifier from one of said primary windings.

3. A circuit as claimed in claim 1 wherein said network means comprises a normally-closed switch and an inductor connected between said second common circuit point and ground across said capacitor, said normally-closed switch being opened upon the removal of a power amplifier from one of said primary windings.

4. A circuit as claimed in claim 1 wherein said network means comprises an inductor connected in series with said capacitor and a normally-closed switch and a further inductor connected between said second common circuit point and ground across the series-connected capacitor and inductor, said normally-closed switch being opened upon the removal of a power amplifier from one of said primary windings.

5. A circuit as claimed in claim 1 wherein said first common circuit point is ground.

6. A circuit as claimed in claim 1 having a plurality n of said equal value inductors, wherein said equal value inductors include a first inductor and a remainder of inductors, and wherein the value of said equal value inductors and the value of said capacitor are established by the following relationship:

$$I_{L1} = (V - V_C)/L,$$

$$I_{Ln} = (V_C + V)/(L + Z_L), (n \neq 1),$$

and $$V_C = (I_{L1} - I_{L2} - \ldots I_{Ln})C,$$

wherein $V_C$ is the voltage across said capacitor, $Z_L$ is the impedance of said load, $I_{L1}$ is the current through said first inductance, $I_{Ln}(n \neq 1)$ is the current through each of said remainder of inductors, L is the inductance of each of said equal value inductors, and V is the voltage across each transformer primary winding.

* * * * *